United States Patent
Alhamud et al.

(10) Patent No.: US 10,018,700 B2
(45) Date of Patent: Jul. 10, 2018

(54) CORRECTING FOR MAIN MAGNETIC FIELD INHOMOGENEITY IN MRI SCANNERS

(71) Applicants: University of Cape Town, Cape Town (ZA); The General Hospital Corporation, Boston, MA (US)

(72) Inventors: Alqadafi Ali Alhamud, Kenilworth (ZA); Ernesta Maria Meintjes, Cape Town (ZA); Andre Jan Willem Van Der Kouwe, Woburn, MA (US)

(73) Assignees: University of Cape Town, Cape Town (ZA); The General Hospital Corporation, Boston, MA (US)

( * ) Notice: Subject to any disclaimer, the term of this patent is extended or adjusted under 35 U.S.C. 154(b) by 452 days.

(21) Appl. No.: 14/796,268

(22) Filed: Jul. 10, 2015

(65) Prior Publication Data

US 2016/0047876 A1 Feb. 18, 2016

(30) Foreign Application Priority Data

Jul. 11, 2014 (GB) .................................. 1412382.2

(51) Int. Cl.
*G01R 33/565* (2006.01)
*G01R 33/563* (2006.01)
(Continued)

(52) U.S. Cl.
CPC ... *G01R 33/56563* (2013.01); *G01R 33/4828* (2013.01); *G01R 33/5616* (2013.01); (Continued)

(58) Field of Classification Search
CPC ............ G01R 33/5616; G01R 33/4828; G01R 33/56341; G01R 33/56509; G01R 33/56563; G01R 33/243
See application file for complete search history.

(56) References Cited

U.S. PATENT DOCUMENTS

| 6,472,872 B1 * | 10/2002 | Jack, Jr. | ............. G01R 33/3875 |
| | | | 324/307 |
| 8,886,283 B1 * | 11/2014 | Chen | ...................... A61B 5/055 |
| | | | 382/128 |

(Continued)

OTHER PUBLICATIONS

Hess et al, Real-time motion and B0 correction for localized adiabatic selective refocusing (LASER) MRSI using echo planar imaging volumetric navigators, NMR in Biomedicine (2012), 25:347-358, noting abstract, "LASER sequence" section from p. 348, figures 1 and 3 especially.

(Continued)

*Primary Examiner* — Patrick Assouad
*Assistant Examiner* — Haidong Zhang
(74) *Attorney, Agent, or Firm* — Rudy J. Ng; Bret E. Field; Bozicevic, Field & Francis LLP

(57) ABSTRACT

A method for correcting for main magnetic field (B0) inhomogeneity in a Magnetic Resonance Imaging (MRI) scanner is disclosed. The method includes applying a first and a second three-dimensional volumetric navigator after an acquisition of a volume in a scanning sequence and before the next volume is acquired. From a resultant pair of navigator images, a magnetic field map is obtained by complex division of the pair of navigator images, and the field map is used to determine parameters to adjust the MRI scanner to compensate for B0 inhomogeneity. The navigators may excite only a portion of an entire object to be imaged, so that adjustment of the MR scanner can be done slice-by-slice or slab-by-slab. Motion correction can also be implemented by comparing the first navigator to a stored reference image and updating for motion before acquisition of the next volume in the scanning sequence.

18 Claims, 3 Drawing Sheets

(51) Int. Cl.
*G01R 33/48* (2006.01)
*G01R 33/561* (2006.01)
*G01R 33/24* (2006.01)

(52) U.S. Cl.
CPC . *G01R 33/56341* (2013.01); *G01R 33/56509* (2013.01); *G01R 33/243* (2013.01)

(56) References Cited

U.S. PATENT DOCUMENTS

| | | | | |
|---|---|---|---|---|
| 2005/0154291 | A1* | 7/2005 | Zhao | G01R 33/3873 600/410 |
| 2013/0002247 | A1* | 1/2013 | Haacke | G01R 33/56545 324/307 |
| 2013/0187649 | A1 | 7/2013 | Bhat et al. | |
| 2015/0272493 | A1* | 10/2015 | Liu | A61B 5/4064 600/410 |
| 2015/0309142 | A1* | 10/2015 | Li | G01R 33/5611 324/309 |
| 2015/0331076 | A1* | 11/2015 | Neji | G01R 33/4835 324/309 |

OTHER PUBLICATIONS

Hess et al, Real-time motion and B0 corrected single voxel spectroscopy using volumetric navigators, Magnetic Resonance in Medicine (2011), 66:314-323, See abstract, col. 1 of p. 314, "The EPI vNAV" section from p. 316 and "discussion" section on p. 322 especially.

Bogner et al., Real-time motion- and B0-correction for Laser-localized spiral-accelerated 3D-MRSI of the brain at 3T, NeuroImage (2014), 88:22-31, See especially abstract, "volumetric navigator" section from p. 23 and "scanner frequency drift correction" sections p. 25 and p. 26 especially.

* cited by examiner

CORRECTING FOR MAIN MAGNETIC FIELD INHOMOGENEITY IN MRI SCANNERS

CROSS-REFERENCE TO RELATED APPLICATIONS

This application claims priority to United Kingdom patent application number 1412382.2 filed on 11 Jul. 2014, which is incorporated by reference herein.

FIELD OF THE INVENTION

This invention relates to correcting for main magnetic field inhomogeneity in imaging scanners such as Magnetic Resonance Imaging (MRI) scanners.

BACKGROUND TO THE INVENTION

Magnetic Resonance Imaging (MRI) involves applying different types of electromagnetic fields and radiofrequency (RF) excitations to a subject. The aim in doing so is to generate spatial RF signals from a specific region of the subject by which an MRI image is generated. The spatial RF signals are proportional to the strength and the homogeneity of the applied magnetic fields. If there is any distortion in the magnetic fields, this causes distortion in the final MRI image which in some cases may lead to a false diagnosis, for example in medical applications where the subject being imaged is a human subject.

Due to the nature of objects being imaged as well as the difficulties attached to engineering magnetic coils, magnetic fields are not perfectly homogeneous. Factors leading to inhomogeneous effects can include internal factors such as production tolerances in the scanner, heating of coils during scanning, vibrations during scanning, or external factors like ferromagnetic material, like iron, that may be in the vicinity of the scanner such as in a surrounding building construction.

MRI scanners have a set of several coils, which typically include a main superconductive coil which produces a powerful main magnetic field (called "B0") which polarizes an object to be scanned, an RF coil for generating and receiving RF pulses, and magnetic field gradient coils that generate spatial variations in the main magnetic field for spatial encoding of the MRI signal. It is not possible to create a perfectly homogenous main magnetic field (B0) within a bore of the MRI scanner. Therefore, MRI scanners generally include shims, which are active or passive devices which can adjust the homogeneity of the magnetic field. Passive shims consist of metal pieces which are positioned during the installation of the MRI scanner to generate tiny static magnetic fields, and cannot be manipulated during an MRI scan. Active shims consist of gradient coils which generate tiny magnetic fields in three perpendicular directions (X, Y and Z). These fields are generated by calculating offset electrical currents which then pass through the gradient coils. The process of adjusting the active shims is called shimming.

In existing MRI scanners, active shimming of the main magnetic field (B0) is performed once before an MRI scan begins. The fields required to be generated by the active shim coils must be determined by first acquiring a map of the main magnetic field, which includes the offset phase in the B0 filed due to filed inhomogeneity (ΔB0). This map can be obtained using various pulse sequence techniques, such as using a two-TE (where TE refers to the echo time) three-dimensional gradient echo sequence. From the field map, zero, first and even higher order shim parameters are calculated and then the drift in the scanner central frequency (the zero order shim) and the offset in the electrical currents of the shim gradients are estimated from the shim parameters.

Some MRI modalities, such as Functional MRI (fMRI) and Diffusion Tensor Imaging (DTI), which are mainly based on echo planar imaging (EPI) for data acquisition, require scanning a volume of a subject repeatedly. Such repeated scanning could take anything between 6 minutes up to about 40 minutes for some DTI applications. During such a long scanning period, the initial shim prepared by the scanner could be compromised, rendering the final MRI images inaccurate. Temporal changes of the initial prepared shimmed main magnetic field may arise due to factors such as patient respiration, poor shimming of the MRI scanner, or generalized and random patient motion. The changes in the main magnetic field, including drift in a system central frequency (zero order shim) and distortion in the shim magnetic field gradients (first or higher order shims), can cause different types of geometrical distortions in an MRI image such as shift, stretching, contraction, signal loss, image blurring and ineffective RF excitation pulses.

Currently, the mechanism by which various sources of distortion affect the change in the main magnetic field is not well understood, and existing scanners generally do not include an ability to compensate for such changes during the course of scanning. The distortion in the B0 field cannot be addressed with external tracking systems. Several techniques, both hardware and software-based, have been proposed to deal with the distortion in the B0 field, but they come with limitations and drawbacks.

The technology described in this application seeks to address these problems, at least to some extent.

SUMMARY OF THE INVENTION

According to the invention there is provided a method of correcting for main magnetic field (B0) inhomogeneity in a Magnetic Resonance Imaging (MRI) scanner during a scanning sequence which includes the acquisition of successive volumes by means of Magnetic Resonance (MR) pulse sequences, comprising:
  after an acquisition of a volume in the scanning sequence:
    applying a first three-dimensional volumetric navigator and obtaining a first navigator image,
    applying a second three-dimensional volumetric navigator after the first navigator and obtaining a second navigator image, wherein the first and second navigators have different echo times;
  after the first and second navigator images have been obtained and before the acquisition of the next volume in the scanning sequence:
    determining a magnetic field map by complex division of the first and second navigator images;
    using the magnetic field map to determine parameters required to adjust the homogeneity of the main magnetic field (B0); and
    adjusting the MRI scanner based on the determined parameters.

Further features provide for the determined parameters to include a zero order shim which is estimated from the magnetic field map based on a least-squares fit, and for the MRI scanner to be adjusted by adjusting a system central frequency of the MRI scanner. The system central frequency of the MRI scanner may be adjusted by adjusting a phase and frequency for a Numerically Controlled Oscillator (NCO) of the MRI scanner for all radiofrequency (RF) excitation pulses of the MRI scanner and for Analog to Digital Converter (ADC) pulses of the MRI scanner for both the scanning sequence and the first and second navigators.

Still further features provide for the determined parameters to include first or higher order shims which are estimated from the magnetic field map, and for the MRI scanner to be adjusted by adjusting one or more shim coils of the MRI scanner with the determined parameters.

Yet further features provide for the method to include:
after obtaining the first navigator image, and during the course of acquiring the second navigator, estimating motion parameters which include three translations and three rotations by comparing the first navigator image to a stored reference image; and
after applying the second navigator and before acquisition of the next volume in the scanning sequence, updating for motion,
so as to correct for motion of an object being imaged.

The first and second navigators are preferably echo planar imaging (EPI) navigators, and the EPI navigators are identical except for having different echo times. The difference in echo times (2.4 milliseconds) between the two navigators is chosen so that a resultant signal produced by the excitation of fat and water by the two EPI navigators is in phase. Therefore, any phase offset in the field map is attributed to the field inhomogeneity. In one embodiment, the main magnetic field (B0) strength is about 3 Tesla and echo times of about 6.6 milliseconds and about 9 milliseconds are chosen for the first and second navigators, so that a resultant signal produced by the excitation of fat and water by the two EPI navigators is in phase.

Further features provide for the scanning sequence to be one of: a Functional Magnetic Resonance Imaging (fMRI) scanning sequence, and a Diffusion Tensor Imaging (DTI) scanning sequence.

Still further features provide for the navigators to have low flip angles to ensure that an MRI contrast of the navigators do not influence a contrast of the MRI scanning sequence. In one embodiment, the flip angle is about 2°.

Yet further features provide for the first and second navigator pulse sequences have a spatial resolution of between 6×6×6 mm³ and 10×10×10 mm³. In one embodiment, the first and second navigator pulse sequences have a spatial resolution of approximately 8×8×8 mm³ and the navigator images are obtained in about 0.48 seconds.

A further feature provides for each three-dimensional volumetric navigator to excite substantially an entire object to be imaged.

In one embodiment, the scanning sequence includes a series of substantially two-dimensional slices of an object to be imaged, and the parameters include zero, first or higher order shims which are estimated from the magnetic field map only for a sub-region of the magnetic field map that corresponds to a slice that is to be acquired next, so that adjustment of the MR scanner is done slice-by-slice to account for main magnetic field (B0) inhomogeneity in the next slice to be imaged.

In a different embodiment, the scanning sequence includes a series of substantially three-dimensional portions, called slabs, of the object to be imaged, and the parameters include zero, first or higher order shims which are estimated from the magnetic field map only for a sub-region of the magnetic field map that corresponds to a slab that is to be acquired next, so that adjustment of the MR scanner is done slab-by-slab to account for main magnetic field (B0) inhomogeneity in the next slab to be imaged.

The method may be applied after the acquisition of every volume in the scanning sequence. Alternatively, the method may be applied after one out of every fixed number of volume acquisitions in the scanning sequence.

BRIEF DESCRIPTION OF THE DRAWINGS

The invention will now be described, by way of example only, with reference to the accompanying representations in which.

DETAILED DESCRIPTION WITH REFERENCE TO THE DRAWINGS

Figure 1:
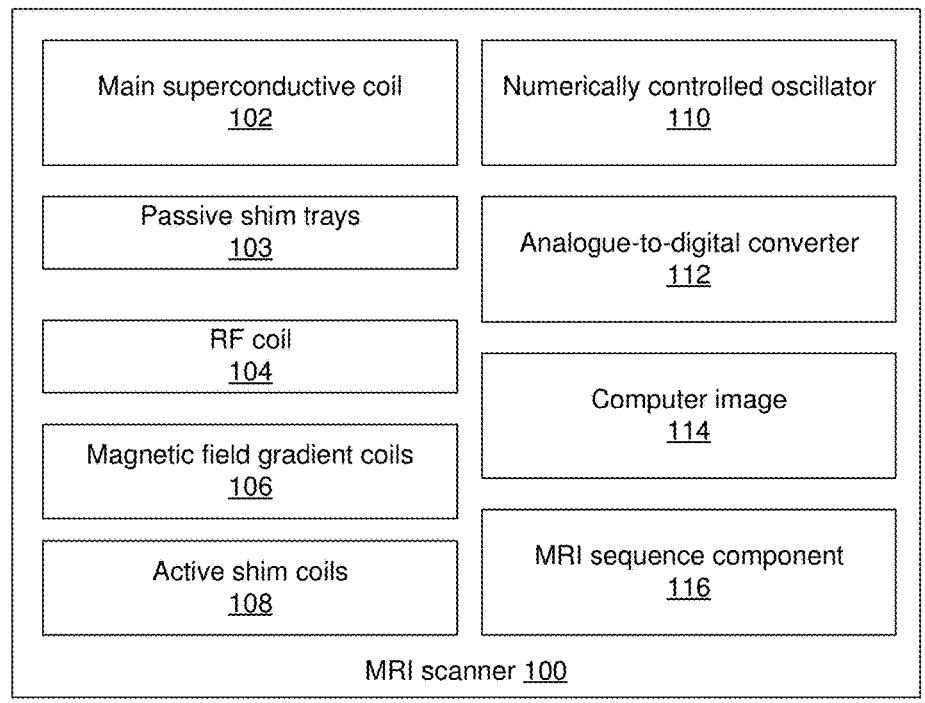
FIG. 1 is a block diagram showing some of the hardware and logical components of a Magnetic Resonance Imaging (MRI) scanner.

FIG. 1 is a block diagram showing some of the hardware and logical components of a Magnetic Resonance Imaging (MRI) scanner (100) used in the invention. The MRI scanner includes a main superconductive coil (102) which produces a powerful main magnetic field, known as "B0". A radiofrequency (RF) coil (104) is provided for generating and receiving RF signals, and magnetic field gradient coils (106) generate spatial variations in the main magnetic field (B0) for spatial encoding of the MRI signals. Passive shim trays (103) made from iron are positioned and adjusted carefully during installation of the MRI scanner until an initial desired level of homogeneity in the B0 field is reached. Active shim gradient coils (108) are also provided, in which electrical current passes through each shim gradient coil to generate small magnetic fields (measured in micro Tesla per meter), that are superimposed on the main magnetic field (B0) to correct inhomogeneity in B0.

The MRI scanner (100) also includes a Numerically Controlled Oscillator (NCO) (110) which is used to adjust a frequency and phase for all RF excitation pulses and the resultant received RF signals. Because of heating of iron shim coils, subject motion or breathing, the phase and frequency of the excitation pulses generated by the RF coil (104) may change, so the NCO is used to adjust the phase and frequency of the RF excitation pulses.

The resultant RF signal received from the subject must be digitized before it can be analyzed and an image constructed therefrom, and an Analog-to-Digital Converter (ADC) (112) is provided for digitizing received analog RF signals. The phase and frequency of the resultant RF signal may change due to inhomogeneity, and therefore the phase and frequency of the NCO (110) of the ADC (112) has to be corrected. The ADC feeds into a computer image (114), which is a logical component that includes all processes and programs related to data acquisition and image calculation and reconstruction.

The MRI scanner (100) is configured by using an MRI sequence component (116), which is a software component by means of which the MRI scanner (100) can be controlled. For example, a radiographer can prepare a specific MRI protocol by using the MRI sequence component (116). The prepared MRI protocol sets out the specific type, duration and other parameters of an MRI scanning sequence, which is then applied to the other hardware components such as the RF coil (104), magnetic field gradient coils (106), and NCO (110) to conduct a scanning sequence.

Figure 2:
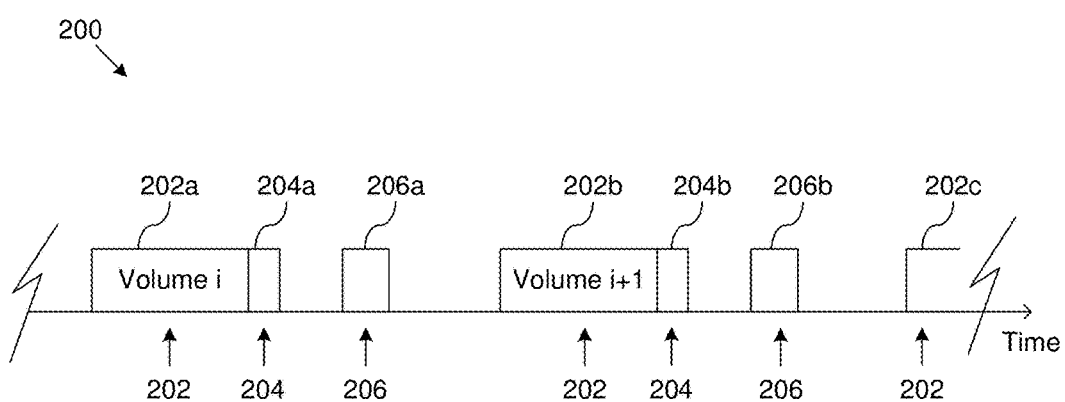
FIG. 2 is a timing diagram of a scanning sequence in which magnetic field inhomogeneity is corrected.

FIG. 2 shows a timing diagram of a scanning sequence (200) in which the distortion in the main magnetic field (B0) is corrected according to the technology. The illustrated pulse sequence is written in an object-oriented program (OOP) and loaded onto the MRI scanner (100). In this illustration, the scanning sequence (200) includes a parent sequence (202) which is either a functional MRI (fMRI) or Diffusion Tensor Imaging (DTI) scanning sequence that includes acquisition of successive volumes of an object being imaged. In this illustrated portion of the timing diagram, the acquisition of three volumes is shown, a first volume (202a), second volume (202b) and third volume (202c), which are successively acquired by the MRI scanner. These volumes could, for example, be imaged volumes in a human subject such as small portions of the human brain.

The scanning sequence includes a first three-dimensional volumetric navigator (204a, 204b) which is applied directly after each volume acquisition (202a, 202b, 202c). In this illustration, two of the navigators (204a, 204b) are shown.

The scanning sequence (200) also includes a second three-dimensional volumetric navigator (206a, 206b) which is applied after each first navigator and before the acquisition of the next volume in the parent scanning sequence (202). In this illustration, two of the navigators (206a, 206b) are shown.

The navigators are three-dimensional navigator echo planar imaging (EPI) pulse sequences. Being three-dimensional, the navigators are volumetric as opposed to linear navigators, where each navigator excites an entire volumetric region. The navigator pulse sequences are identical except that they have different echo times. An echo time is the time between the applied RF excitation pulse and the peak of the resultant echo signal. In one experiment, an echo time of 6.6 milliseconds was chosen for the first navigator and an echo time of 9 milliseconds was chosen for the second navigator. This difference of 2.4 milliseconds was chosen so that the resultant signal produced by the excitation of fat and water by the two EPI navigators is in phase, so that any phase offset in the filed map is attributable to inhomogeneity in the main magnetic field. In other words, any phase evolution between the two navigators is not affected by the phase difference of fat and water in an imaged subject, but the phase evolution is instead accumulated due to main magnetic field (B0) inhomogeneity.

The navigators are chosen to have a low flip angle to ensure that an MRI contrast of the navigators do not seriously influence a contrast of the parent sequence (202). The flip angle is the rotation of the net magnetization vector by an RF pulse relative to the main magnetic field (B0). In one experiment, a flip angle of 2° was chosen. The navigator pulse sequences are also chosen to have a sufficiently low spatial resolution so that resultant navigator images can be obtained in a sufficiently short space of time before the acquisition of the next volume in the scanning sequence. In one experiment, the navigator sequences may have spatial resolutions of 8×8×8 mm$^3$ in which case the navigator images can be obtained in approximately 0.475 seconds. Spatial resolution of the navigator is a trade-off between accuracy and acquisition time for the navigator. Other spatial resolutions that the navigator could have are between 6×6×6 mm$^3$ and 10×10×10 mm$^3$.

For each navigator, the computer image (114) obtains a resultant navigator image that includes both magnitude and phase. During scanning, the first navigator image is affected by a field inhomogeneity of a phase of $\Delta\phi t1$, and the second navigator image is affected by different phase $\Delta\phi t1+\tau$, due to its different echo time. Because the two navigators share a phase of $\Delta\phi t1$, a three-dimensional field map $\Delta\phi\tau$ that covers the whole volume of the volumetric navigators can be obtained by complex division of the two navigators' images. Complex division is the division of two complex numbers, which can be done according to known techniques by multiplying the numerator and the denominator by the complex conjugate of the denominator.

The three-dimensional field map $\Delta\phi\tau$ is directly proportional to the main magnetic field inhomogeneity. From the field map, shimming parameters with different spatial orders can be estimated. A zero order shim is estimated from the magnetic field map by estimating the mean phase offset. A first order (linear) shim is estimated from the magnetic field map by fitting a spatially linear function. Higher order shims are estimated by fitting higher-order functions such as spherical harmonic functions.

The zero order shim represents a correction to drift in the main magnetic field (B0). To compensate for the drift in the main magnetic field, the system central frequency of the MRI scanner is adjusted. Adjustment of the central frequency can be done by adjusting the phase and frequency for the Numerically Controlled Oscillator (110) of the MRI scanner for all RF excitation pulses of the MRI scanner and for the analog to digital converter (112) pulses for both the scanning sequence and the two navigator sequences. Adjusting the analog to digital converter is done by adding an offset phase to each line of K-space.

Shimming parameters of first or even second or higher order can also be estimated from the magnetic field map based on a least-squares fit. For first or higher order shims, the MRI scanner is adjusted by adjusting one or more of the active shim coils (108). The required currents for optimizing the shim coils are obtained from the shim parameters according to known techniques and the active shimming coils (108) activated so as to adjust the homogeneity of the main magnetic field. Typically, calculated shim offsets are added to initial shims that are prepared by the MRI scanner. Linear shims may, for example, be implemented by adding a constant current to the gradient coils and only this linear term (and of course the frequency offset) can be adjusted in real time.

Typically, each three-dimensional volumetric navigator excites substantially an entire object to be imaged, such as a human brain. In one embodiment, the fMRI or DTI scanning sequence includes a series of substantially two-dimensional slices of the object to be imaged. By "two-dimensional" it is meant that the acquired volume is one voxel thick. Zero, first or higher order shims are estimated from the magnetic field map only for a sub-region of the magnetic field map that corresponds to a slice that is to be acquired next, so that adjustment of the MR scanner is done slice-by-slice to account for main magnetic field (B0) inhomogeneity in the next slice to be imaged. By estimating only the shim that matters for the next slice to be collected, a better shim for that slice is possible rather than calculating the optimum across the whole object. This is very useful in cases where the object being imaged is known to contain local disturbances in the main magnetic field (B0) homogeneity, such as with the brain. Having a three-dimensional volumetric navigator enables through-plane estimation of the shim (i.e. fit in the direction perpendicular to the plane of the slice).

In another embodiment, the scanning sequence includes a series of substantially three-dimensional portions, called slabs, of the object to be imaged, and the parameters include zero, first or higher order shims which are estimated from the magnetic field map only for a sub-region of the magnetic field map that corresponds to a slab that is to be acquired next, so that adjustment of the MR scanner is done slab-by-slab to account for main magnetic field (B0) inhomogeneity in the next slab to be imaged.

In FIG. 2 the two navigators (204, 206) are applied after the acquisition of each volume (202) in the scanning sequence. The invention also extends to a method in which navigators are applied to one out of a fixed number of volume acquisitions in the scanning sequence, such as after every second, third, or fourth volume acquisition only.

Subject motion, such as the movement of a patient's head while in an MRI scanner, alters the initial shim prepared by the scanner. The technology described also allows motion correction to be implemented by estimating motion parameters which include three translations and three rotations by comparing the first volumetric navigator to a stored reference image, and updating for motion before acquisition of the next volume in the scanning sequence. This will be further described below.

Figure 3:
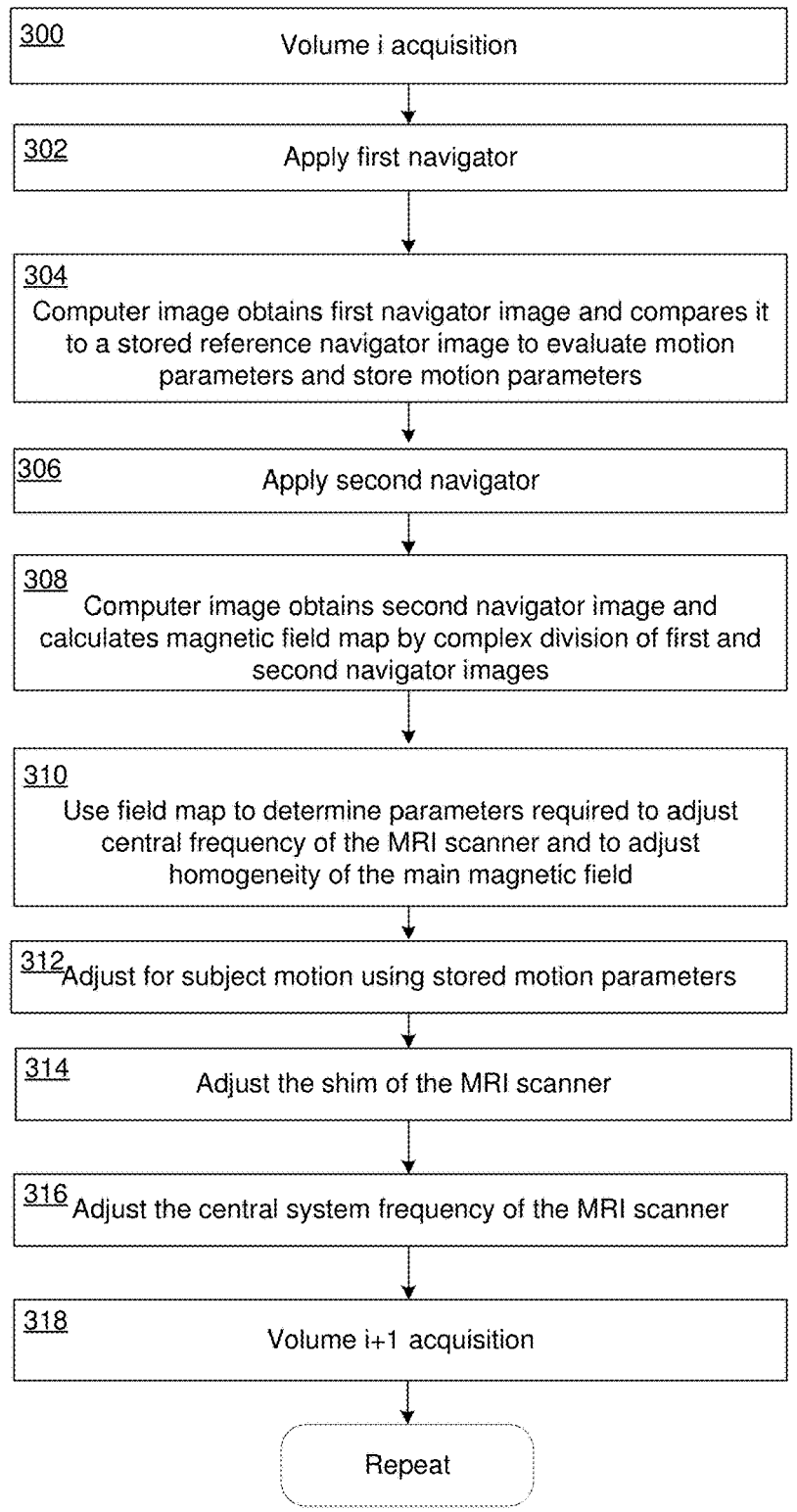
FIG. 3 is a flow diagram showing how corrections for magnetic field inhomogeneity and subject motion can be achieved with the scanning sequence shown in FIG. 2.

FIG. 3 is a flow diagram that shows successive stages carried out in a method of correcting for main magnetic field (B0) inhomogeneity and also correcting for subject motion, and is to be understood with reference to the timing diagram of FIG. 2 and the block diagram of FIG. 1.

At a first stage (300), the first volume i (202a) of DTI or fMRI is acquired during a pulse sequence that is part of the parent sequence (202). At a next stage (302), the first navigator (204a) is applied immediately after the first volume acquisition (202a). At a next stage (304), the computer image (114) obtains a first navigator image and compares it to a stored reference navigator image, which is typically the immediately preceding navigator image. By comparing these images, the computer image (114) is able to obtain motion parameters that include three translations and three rotations, which are the parameters required to calculate both translation and motion in a three axis (x, y and z) coordinate system. Motion calculation is done by the computer image (114) and these motion parameters are then sent and stored in the MRI sequence component (116). In one experiment, the required time for motion calculation by the computer image (114) and delivery to the MRI sequence component (116) was approximately 100 milliseconds.

At a next stage (306), the second navigator (206a) is then applied. Note that motion correction has not yet been done, as the second navigator (206a) needs to be in the same position as the first navigator (204a). By acquiring the volume with the first TE (first navigator) separately and prior to the volume with the second TE (second navigator), registration of the first navigator volume to the reference navigator volume can be completed during the acquisition of the second navigator thus reducing the calculation time, and required pause in the sequence, after the second navigator. At a next stage (308), the computer image (114) obtains the second navigator image and calculates a magnetic field map by complex division of the first and second navigator images as previously explained.

The field map is then used, at a next stage (310), to determine parameters that are required to adjust the central system frequency of the MRI scanner (the zero order shim) and the homogeneity of the main magnetic field (B0) through higher order shims. The computer image (114) then sends and stores these parameters in the MRI sequence component (116). The required time for calculation of the parameters and delivery to the MRI sequence component in one experiment was approximately 80 milliseconds.

At a next stage (312), and before shim correction starts, the MRI sequence component (116) adjusts for subject motion using the stored motion parameters. This is done by reorienting the scanner coordinate system and accordingly all gradients are reoriented to the correct position and also all RF and ADC pulses through the NCO are corrected for the measured shift in the position of the subject.

Following motion correction, at a next stage (314), the shim of the MRI scanner (100) is then adjusted as previously described to compensate for the inhomogeneity in the main magnetic field (B0), and at a next stage (316) the central frequency of MRI scanner is adjusted by adjusting a phase and frequency of the NCO (110) for all RF excitation pulses and for the analog to digital converter (ADC) pulses of the MRI scanner for both the parent sequence (202) and the two navigator sequences (204, 206).

In this way, the next volume i+1 acquisition (202b), which is shown at a next stage (318), is done with corrections for all three of: central frequency drift (zero order shim), higher order magnetic field inhomogeneity (higher order shim) and subject motion. The process then repeats itself. The required time for the error correction in one experiment was 1,150 milliseconds, and this time could be shortened further by using a lower resolution for the navigators or faster processing of the algorithms.

It is well known that certain portions of an imaged object, such as certain portions of the brain, have different levels of B0 homogeneity distortion. As described above, the technology of this application can be applied to create sub-field maps which are mapped to different regions or locations in the imaged object. These sub-field maps can be used to measure and correct, in real-time, the zero and higher order shim parameters over different regions in the object being imaged. Shimming can therefore be done in a slab-by-slab fashion, where each "slab" is a single excited three-dimensional volume, or, in the case of two-dimensional imaging, in a slice-by-slice fashion where a "slice" is a thin slab one voxel thick.

Experimental Results

The disclosed technique was applied on an Allegra 3T MRI scanner manufactured by Siemens®. A stationary water phantom was first scanned to validate the accuracy of the technique in evaluating the drift in the B0 field and the distortion in the shim magnetic field gradients. The system frequency initially prepared by the MRI scanner before acquisition was manually offset in 6 different scans by 5, 10, 20, 40, 70 and 100 Hz respectively. A static shim initially prepared by the scanner before the acquisition sequence was manually adjusted by 15 µT/m in the x direction, 15 µT/m in both the x and y direction, and finally 15 µT/m in x, y and z directions. A zero order shim was calculated to obtain the drift in the B0 field, and first order linear shim gradients (Gx, Gy, and Gz) were obtained to determine inhomogeneous effects.

Figure 4A:
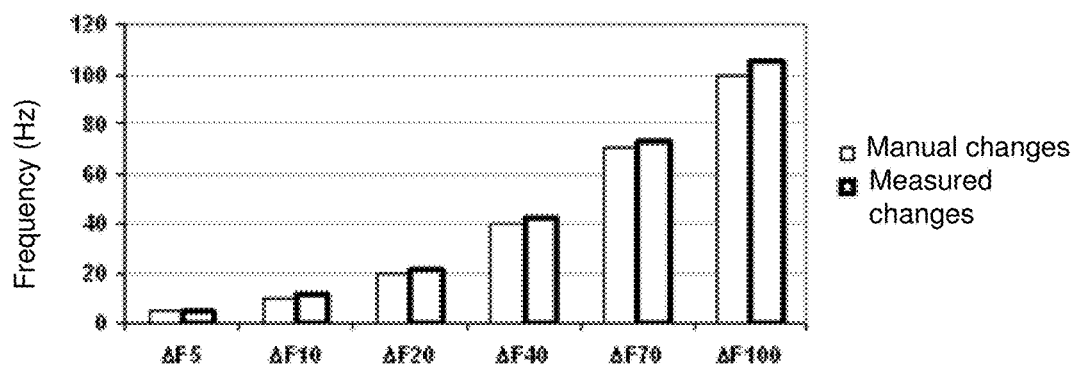
FIG. 4A is a graph showing manual changes in scanner central frequency and measured changes by the proposed technique.

FIG. 4A is a graph that shows the ability of the disclosed technique to measure the manual changes that were made to the scanner central frequency. As can be seen, when the frequency is manually changed, the technique accurately measures those changes. The technique is thus effective in measuring and correcting changes in the scanner central frequency that may result from, for example, heating of the iron comprising the shim coils.

Figure 4B:
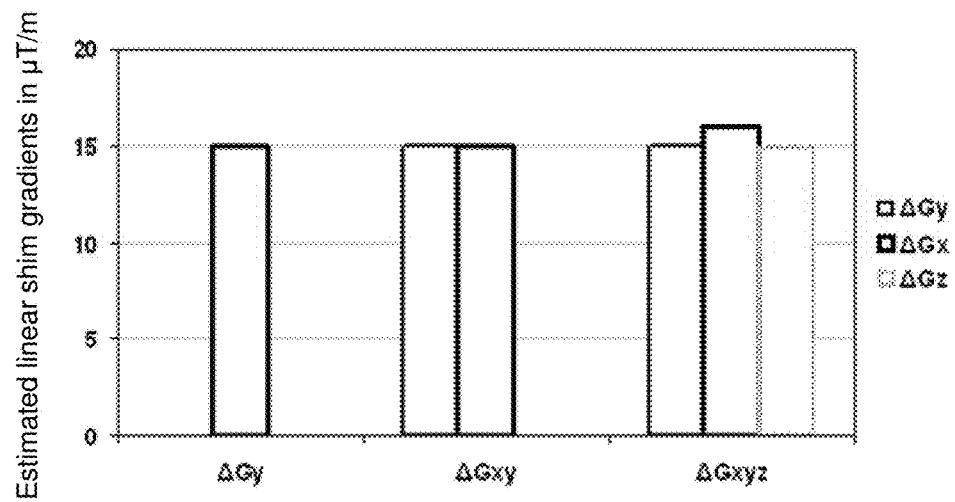
FIG. 4B is a graph showing measured linear shim gradients by the proposed technique following manual distortion of a static shim.

FIG. 4B is a graph that shows the ability of the disclosed technique to measure manual changes of 15 μT/m made in the linear shim gradients in x, then x and y, and finally x, y and z directions. As can be seen, where the linear shim gradients are manually changed, the technique accurately measures those changes. The technique is thus effective in measuring and correcting changes required to adjust first order linear shims to compensate for inhomogeneity in the main magnetic field (B0).

In experiments on human subjects, it was found that subject motion alters the initial shim and can produce a significant frequency drift which can cause a shift of approximately 3 mm (which equates to 30 Hz) in the image space. The techniques described herein are able to simultaneously correct for both subject motion and drift in the main magnetic field (B0), which cannot be addressed with external tracking systems or prospective or retrospective motion correction. Another advantage of the disclosed technique is the ability to shim over a specific region in a slab-by-slab or slice-by slice fashion, which can be important when scanning a small region.

The described technique is able to measure, report and correct, in real time, for changes in the main magnetic field, changes in first order shims and subject motion simultaneously. The correlation between subject motion, motion correction, the drift in the scanner central frequency and first order shims can be studied. Higher order shims can be implemented if the hardware of the MRI scanner allows for this.

The invention claimed is:

1. A method of correcting for main magnetic field (B0) inhomogeneity in a Magnetic Resonance Imaging (MRI) scanner during a scanning sequence which includes the acquisition of successive volumes by means of Magnetic Resonance (MR) pulse sequences, comprising:
   after an acquisition of a volume in the scanning sequence:
   applying, by the MRI scanner, a first three-dimensional volumetric navigator and obtaining a first navigator image,
   applying, by the MRI scanner, a second three-dimensional volumetric navigator after the first navigator and obtaining a second navigator image, wherein the first and second navigators have different echo times;
   after the first and second navigator images have been obtained and before the acquisition of the next volume in the scanning sequence:
   determining a magnetic field map by complex division of the first and second navigator images;
   using the magnetic field map to determine parameters required to adjust the homogeneity of the main magnetic field (B0), the determined parameters including a zero order shim which is estimated from the magnetic field map based on a least-squares fit; and
   adjusting the MRI scanner based on the determined parameters by adjusting a system central frequency of the MRI scanner, the system central frequency being adjusted by adjusting a phase and frequency for a Numerically Controlled Oscillator (NCO) of the MRI scanner for all radiofrequency (RF) excitation pulses of the MRI scanner and for Analog to Digital Converter (ADC) pulses of the MRI scanner for both the scanning sequence and for the first and second navigators.

2. The method as claimed in claim 1, wherein the determined parameters include first or higher order shims which are estimated from the magnetic field map, and wherein the MRI scanner is adjusted by adjusting one or more shim coils of the MRI scanner with the determined parameters.

3. The method as claimed in claim 1, which includes:
   after obtaining the first navigator image, and during the course of acquiring the second navigator, estimating motion parameters which include three translations and three rotations by comparing the first navigator image to a stored reference image; and
   after applying the second navigator and before acquisition of the next volume in the scanning sequence, updating for motion,
   so as to correct for motion of an object being imaged.

4. The method as claimed in claim 1, wherein the first and second navigators are echo planar imaging (EPI) navigators, and where the EPI navigators are identical except for having different echo times.

5. The method as claimed in claim 4, wherein the difference in the echo times for the first EPI navigator and second EPI navigator is chosen so that a resultant signal produced by the excitation of fat and water by the two EPI navigators is in phase, so that any phase offset in the filed map is attributable to inhomogeneity in the main magnetic field.

6. The method as claimed in claim 5, wherein the main magnetic field (B0) strength is about 3 Tesla and wherein echo times of about 6.6 milliseconds and about 9 milliseconds are chosen for the first and second navigators.

7. The method as claimed in claim 1, wherein the scanning sequence is one of: a Functional Magnetic Resonance Imaging (fMRI) scanning sequence, and a Diffusion Tensor Imaging (DTI) scanning sequence.

8. The method as claimed in claim 1, wherein the navigators have low flip angles to ensure that an MRI contrast of the navigators do not influence a contrast of the MRI scanning sequence.

9. The method as claimed in claim 8, wherein the flip angle is about 2°.

10. The method as claimed in claim 1, wherein the first and second navigator pulse sequences have a spatial resolution of between 6×6×6 mm$^3$ and 10×10×10 mm$^3$.

11. The method as claimed in claim 10, wherein the first and second navigator pulse sequences have a spatial resolution of approximately 8×8×8 mm$^3$ and the navigator images are obtained in about 0.48 seconds.

12. The method as claimed in claim 1, wherein each three-dimensional volumetric navigator excites substantially an entire object to be imaged.

13. The method as claimed in claim 1, wherein the scanning sequence includes a series of substantially two-dimensional slices of an object to be imaged.

14. The method as claimed in claim 13, wherein the parameters include zero, first or higher order shims which are estimated from the magnetic field map only for a sub-region of the magnetic field map that corresponds to a slice that is to be acquired next, so that adjustment of the MR scanner is done slice-by-slice to account for main magnetic field (B0) inhomogeneity in the next slice to be imaged.

15. The method as claimed in claim 1, wherein the scanning sequence includes a series of substantially three-dimensional portions, called slabs, of the object to be imaged.

16. The method as claimed in claim 15, wherein the parameters include zero, first or higher order shims which are estimated from the magnetic field map only for a sub-region of the magnetic field map that corresponds to a slab that is to be acquired next, so that adjustment of the MR scanner is done slab-by-slab to account for main magnetic field (B0) inhomogeneity in the next slab to be imaged.

17. The method as claimed in claim 1, in which the method is applied after the acquisition of every volume in the scanning sequence.

18. The method as claimed in claim 1, in which the method is applied after one out of every fixed number of volume acquisitions in the scanning sequence.

* * * * *